United States Patent
Ohkawa

(10) Patent No.: US 7,199,026 B2
(45) Date of Patent: Apr. 3, 2007

(54) SEMICONDUCTOR DEVICE, CUTTING EQUIPMENT FOR CUTTING SEMICONDUCTOR DEVICE, AND METHOD FOR CUTTING THE SAME

(75) Inventor: Makoto Ohkawa, Kariya (JP)

(73) Assignee: Denso Corporation, Kariya (JP)

( * ) Notice: Subject to any disclaimer, the term of this patent is extended or adjusted under 35 U.S.C. 154(b) by 278 days.

(21) Appl. No.: 10/952,782

(22) Filed: Sep. 30, 2004

(65) Prior Publication Data

US 2005/0082644 A1    Apr. 21, 2005

(30) Foreign Application Priority Data

Oct. 1, 2003    (JP)    ............... 2003-343131

(51) Int. Cl.
   *H01L 21/00*    (2006.01)
(52) U.S. Cl. ............... 438/463; 438/460; 438/462
(58) Field of Classification Search ............... 438/460, 438/462, 463
   See application file for complete search history.

(56) References Cited

U.S. PATENT DOCUMENTS

| | | | |
|---|---|---|---|
| 5,250,836 A | 10/1993 | Miura et al. | |
| 6,737,606 B2 * | 5/2004 | Peng et al. | 219/121.68 |
| 6,914,327 B2 * | 7/2005 | Shizuno | 257/698 |
| 7,101,797 B2 * | 9/2006 | Yuasa | 438/689 |
| 2004/0002199 A1 | 1/2004 | Fukuyo et al. | |

FOREIGN PATENT DOCUMENTS

| | | |
|---|---|---|
| JP | A-3-71987 | 3/1991 |
| WO | WO 00/54090 | 9/2000 |

OTHER PUBLICATIONS

Notice of Preliminary Rejection issued from Korean Patent Office issued on Jan. 11, 2006 for the corresponding Korean patent application No. 10-2004-0077998 (a copy and English translation thereof).

First Office Action from Chinese Patent Office issued on Jun. 30, 2006 for the corresponding Chinese patent application No. 200410084958.X (a copy and English translation thereof).

Notice of Final Rejection from Korean Patent Office issued on Aug. 3, 2006 for the corresponding Korean patent application No. 10-2004-0077998 (a copy and English translation thereof).

* cited by examiner

*Primary Examiner*—Michael Lebentritt
*Assistant Examiner*—Angel Roman
(74) *Attorney, Agent, or Firm*—Posz Law Group, PLC

(57) ABSTRACT

A method for cutting a semiconductor device is provided. The device includes a first semiconductor layer, an insulation layer, and a second semiconductor layer. The method includes the steps of: forming a semiconductor part in the first semiconductor layer; irradiating a laser beam on a surface of the first semiconductor layer; and cutting the device into a semiconductor chip by using the laser beam. The laser beam is reflected at an interface so that a first reflected beam is generated, and the laser beam is reflected at another interface so that a second reflected beam is generated. The insulation film has a thickness, which is determined to weaken the first and second reflected beams each other.

22 Claims, 10 Drawing Sheets

SEMICONDUCTOR DEVICE, CUTTING EQUIPMENT FOR CUTTING SEMICONDUCTOR DEVICE, AND METHOD FOR CUTTING THE SAME

CROSS REFERENCE TO RELATED APPLICATION

This application is based on Japanese Patent Application No. 2003-343131 filed on Oct. 1, 2003, the disclosure of which is incorporated herein by reference.

FIELD OF THE INVENTION

The present invention relates to a semiconductor device, cutting equipment for cutting a semiconductor device, and a method for cutting the semiconductor device.

BACKGROUND OF THE INVENTION

In prior, a silicon wafer (i.e., Si wafer) having a semiconductor integrated circuit formed thereon is divided into multiple semiconductor chips by a dicing method. In the method, a cutter such as a dicing blade having a diamond abrasive coating is used for the dicing method. This prior method has the following difficulties.

Firstly, to cut by the dicing blade, a reserve part for cutting is necessitated. Therefore, the number of the chips to be divided from the wafer is reduced because of the reserve part. Thus, the manufacturing cost for manufacturing the chips increases. Further, when the wafer is diced, a frictional heat is generated. The frictional heat may cause a seizing of the blade or a clogging. To prevent the seizing or the clogging, water or machining oil is necessitated. In this case, if the semiconductor device is damaged when the water or the machining oil contacts the semiconductor device on the wafer, a protection film such as capping layer for coating the semiconductor device is required. Thus, the manufacturing cost becomes also larger.

Here, a laser dicing method for dividing the wafer by using a laser beam is disclosed, for example, in Japanese Patent Application Publication No. 2002-192367. In this method, the laser beam is irradiated on the wafer so that heat is generated in the wafer. Then, the wafer is cut and divided into multiple chips.

However, when a SOI substrate (i.e., silicon on insulator substrate) having a support substrate, an insulation layer (i.e., BOX) and a SOI layer, which are laminated in this order, is cut by the above method, a reflection light of the laser beam at interfaces among the BOX and the semiconductor layers interferes. Therefore, reflection coefficient of the laser beam is changed largely in accordance with the film thickness of the SOI layer. Thus, it is difficult to absorb the laser beam at a predetermined position. Specifically, the wafer is not cut precisely by the laser beam at a predetermined position. Here, the SOI layer and the support substrate are made of silicon.

SUMMARY OF THE INVENTION

In view of the above-described problem, it is an object of the present invention to provide a semiconductor device. It is another object of the present invention to provide manufacturing equipment for manufacturing a semiconductor chip from a semiconductor device. It is further another object of the present invention to provide a method for manufacturing a semiconductor chip from a semiconductor device.

Specifically, the present invention relates that a SOI substrate as a semiconductor device having multiple semiconductor parts formed thereon is divided into multiple semiconductor chips by using a laser dicing method. In the present invention, the laser beam can be absorbed at a predetermined position even when a thickness of the SOI substrate is deviated. Thus, the semiconductor device can be cut precisely by the laser beam at the predetermined position.

A method for cutting a semiconductor device is provided. The device includes a first semiconductor layer, an insulation layer, and a second semiconductor layer, which are laminated in this order. The method includes the steps of: forming a semiconductor part in the first semiconductor layer; irradiating a laser beam on a surface of the first semiconductor layer; and cutting the device into a semiconductor chip by using the laser beam. The laser beam is reflected at an interface between the first semiconductor layer and the insulation layer so that a first reflected beam is generated, and the laser beam is reflected at an interface between the insulation layer and the second semiconductor layer so that a second reflected beam is generated. The insulation film has a thickness, which is determined to weaken the first and second reflected beams each other.

In this method, the laser beam can be absorbed at a predetermined position even when a thickness of the first layer is deviated. Thus, the semiconductor device can be cut precisely by the laser beam at the predetermined position.

Further, a method for cutting a semiconductor device is provided. The device includes a first semiconductor layer, an insulation layer, and a second semiconductor layer, which are laminated in this order. The method includes the steps of: forming a semiconductor part in the first semiconductor layer; irradiating a laser beam on a surface of the first semiconductor layer; forming an anti-reflection film on the surface of the first semiconductor layer before the step of irradiating the laser beam on the surface of the first semiconductor layer so that the laser beam is irradiated on the first semiconductor layer through the anti-reflection film; and cutting the device into a semiconductor chip by using the laser beam. The laser beam is reflected at an interface between the anti-reflection film and the first semiconductor layer so that a third reflected beam is generated, and the laser beam is reflected on the anti-reflection film so that a fourth reflected beam is generated. The anti-reflection film has a thickness, which is determined to weaken the third and fourth reflected beams each other.

In this method, the laser beam can be absorbed at a predetermined position even when a thickness of the first layer is deviated. Thus, the semiconductor device can be cut precisely by the laser beam at the predetermined position.

Further, a semiconductor device includes: a substrate including a first semiconductor layer, an insulation layer, and a second semiconductor layer, which are laminated in this order; a semiconductor part disposed in the first semiconductor layer; and a cut portion for cutting the substrate into a semiconductor chip by using a laser beam. The first semiconductor layer, the insulation layer, and the second semiconductor layer have predetermined refractive indexes, respectively, which perform that the laser beam is reflected at an interface between the first semiconductor layer and the insulation layer so that a first reflected beam is generated, and that the laser beam is reflected at an interface between the insulation layer and the second semiconductor layer so that a second reflected beam is generated. The insulation film has a thickness, which is determined to weaken the first and second reflected beams each other.

In this case, the laser beam can be absorbed at a predetermined position even when a thickness of the first layer is deviated. Thus, the semiconductor device can be cut precisely by the laser beam at the predetermined position.

Further, a semiconductor device includes: a substrate including a first semiconductor layer, an insulation layer, and a second semiconductor layer, which are laminated in this order; a semiconductor part disposed in the first semiconductor layer; a cut portion for cutting the substrate into a semiconductor chip by using a laser beam; and an anti-reflection film on the surface of the first semiconductor layer for being capable of irradiating the laser beam on the first semiconductor layer through the anti-reflection film. The anti-reflection film and the first semiconductor layer have predetermined refractive indexes, respectively, which perform that the laser beam is reflected at an interface between the anti-reflection film and the first semiconductor layer so that a third reflected beam is generated, and that the laser beam is reflected on the anti-reflection film so that a fourth reflected beam is generated. The anti-reflection film has a thickness, which is determined to weaken the third and fourth reflected beams each other.

In this case, the laser beam can be absorbed at a predetermined position even when a thickness of the first layer is deviated. Thus, the semiconductor device can be cut precisely by the laser beam at the predetermined position.

Further, cutting equipment for cutting a semiconductor device is provided. The device has a first semiconductor layer, an insulation layer, and a second semiconductor layer, which are laminated in this order. The equipment includes: a laser for irradiating a laser beam on a surface of the first semiconductor layer so that the device is cut into a semiconductor chip. The laser beam is reflected at an interface between the first semiconductor layer and the insulation layer so that a first reflected beam is generated, and the laser beam is reflected at an interface between the insulation layer and the second semiconductor layer so that a second reflected beam is generated. The insulation film has a thickness, which is determined to weaken the first and second reflected beams each other.

In this case, the laser beam can be absorbed at a predetermined position even when a thickness of the first layer is deviated. Thus, the semiconductor device can be cut precisely by the laser beam at the predetermined position.

Further, cutting equipment for cutting a semiconductor device is provided. The device includes a first semiconductor layer, an insulation layer, and a second semiconductor layer, which are laminated in this order. The equipment includes: a laser for irradiating a laser beam on a surface of the first semiconductor layer so that the SOI device is cut into a semiconductor chip. The device further includes an anti-reflection film on the surface of the first semiconductor layer so that the laser beam is irradiated on the first semiconductor layer through the anti-reflection film. The laser beam is reflected at an interface between the anti-reflection film and the first semiconductor layer so that a third reflected beam is generated, and the laser beam is reflected on the anti-reflection film so that a fourth reflected beam is generated. The anti-reflection film has a thickness, which is determined to weaken the third and fourth reflected beams each other.

In this case, the laser beam can be absorbed at a predetermined position even when a thickness of the first layer is deviated. Thus, the semiconductor device can be cut precisely by the laser beam at the predetermined position.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
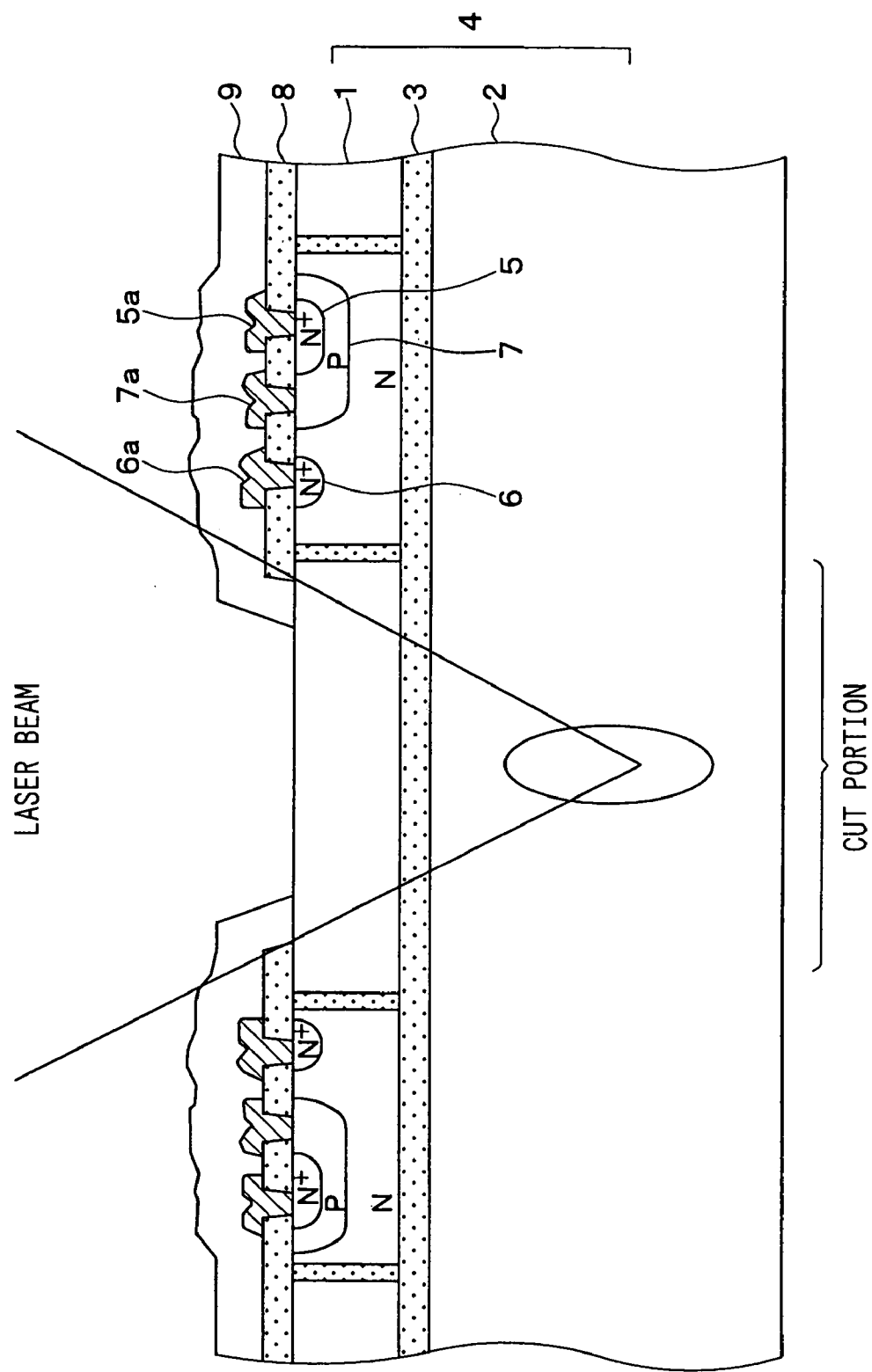
FIG. 1 is a cross-sectional view explaining a laser beam dicing method for dicing a semiconductor device according to a first embodiment of the present invention.

A method for dicing a semiconductor wafer (i.e., a semiconductor device) by using a laser beam according to a first embodiment of the present invention is shown in FIG. 1. The semiconductor device 10 is cut (i.e., diced) and divided into multiple semiconductor chips by the laser dicing method.

In FIG. 1, the semiconductor device 10 is shown before the device 10 is divided into the chips. The semiconductor device 10 is formed from a silicon wafer. The semiconductor device 10 is formed of a SOI substrate 4 having a SOI layer 1, a BOX 3 and a support substrate 2, which are laminated and bonded in this order. The SOI layer 1 as the first silicon layer and the support substrate 2 as the second silicon layer are made of, for example, silicon. The BOX 3 as an insulation layer is made of, for example, silicon oxide. In the SOI layer 1, a semiconductor part is formed by using a conventional manufacturing method. In FIG. 1, for example, the semiconductor part includes a N+ type emitter region 5, a collector region 6, a P type base region 7, and a contact hole. The contact hole is formed in an interlayer insulation film 8. The interlayer insulation film 8 is formed on the surface of the SOI layer 1. An emitter electrode 5a, a collector electrode 6a and a base electrode 7a are electrically connected to the regions 5-7 through the contact hole, respectively. Thus, a NPN type bipolar transistor as a semiconductor part is formed on the SOI substrate 4. Thus, each semiconductor chip includes the NPN type bipolar transistor. A laser scribing portion (i.e., a cut portion) is disposed between the parts so that the cut portion is used as a reserve part for cutting by the laser beam dicing method.

A protection film 9 is formed on the surface of the SOI layer 1. The protection film 9 covers the surface of the electrodes 5a–7a and the interlayer insulation film 8. A part of the protection film 9 is removed so that the SOI layer 1 at the cut portion is exposed outside from the protection film 9.

The semiconductor device 10 is cut by the lased beam dicing method in air or in vacuum. Specifically, the cut portion of the SOI substrate 4 is irradiated with the laser beam from a SOI layer side. The laser beam is focused on a predetermined depth. Thus, the laser beam is absorbed in the predetermined position, i.e., the cut portion, so that the silicon composing the SOI substrate 4 at the predetermined position is transformed. Residual stress is applied to the transformed portion at the predetermined position after the laser beam is irradiated. By the residual stress, the SOI substrate 4 is easily and spontaneously divided, i.e., cleaved so that the SOI substrate 4 is divided into the chips at the predetermined position, i.e., the cut portion.

In the above method for manufacturing the chips, even when the thickness of the SOI layer 1 may have a deviation, since the thickness of the BOX 3 is determined appropriately the laser beam reaches the predetermined position and the laser beam is absorbed at the predetermined position. Thus, the SOI substrate 4 is divided into the chips at the predetermined cut portion precisely. The thickness of the BOX 3 is determined on the basis of simulation results. The simulation results and the thickness of the BOX 3 are explained as follows.

Figure 2:
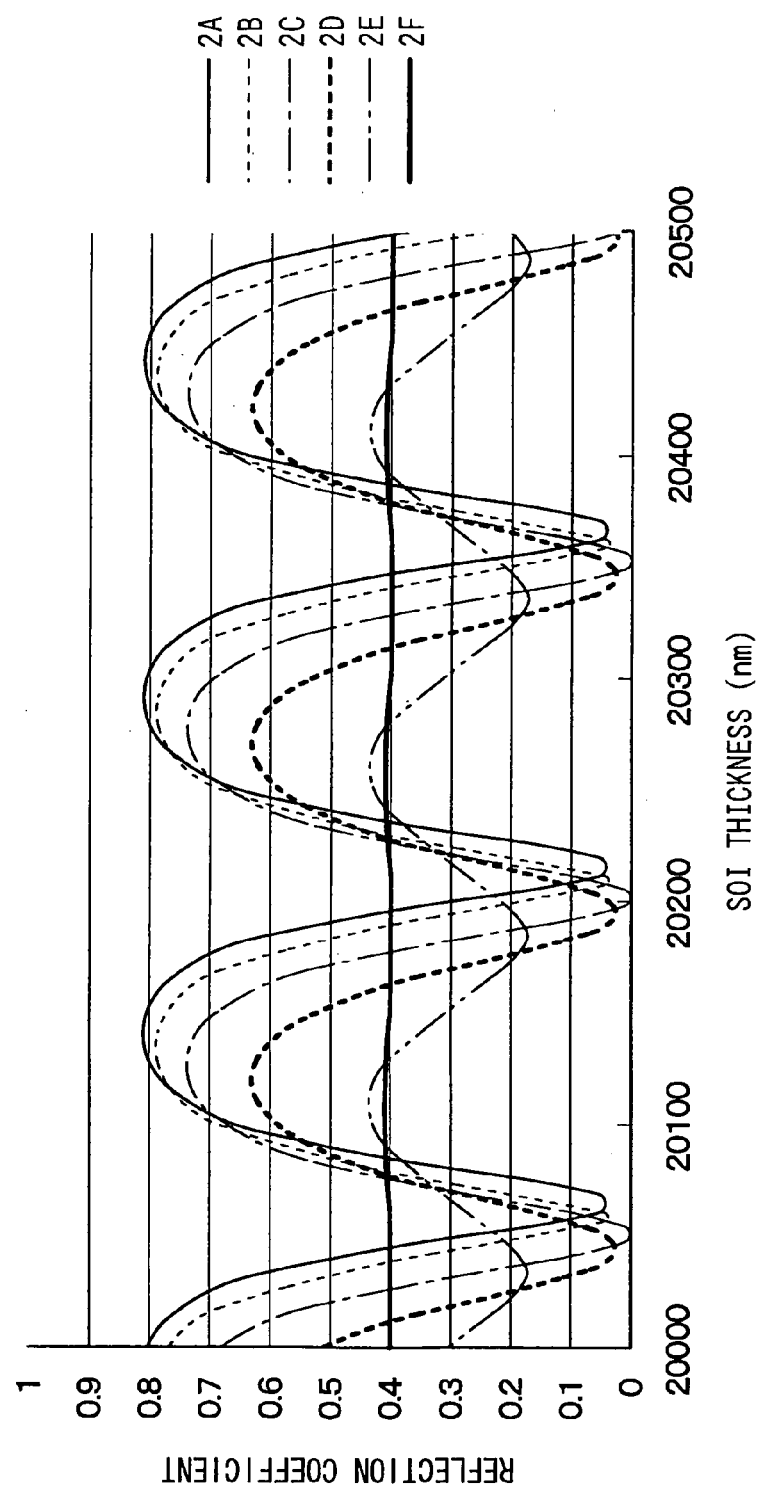
FIG. 2 is a graph showing a relationship between a reflection coefficient of a laser beam and a thickness of a SOI layer in the device having different thickness of a BOX, according to the first embodiment.

FIG. 2 shows a relationship between a reflection coefficient of the laser beam and the thickness of the SOI layer 1 in a case where the semiconductor device 10 has different thickness of the BOX 3. Here, curves 2A–2F show the devices 10 having the thickness of the BOX 3 of 920 nm, 960 nm, 1000 nm, 1040 nm, 1080 nm and 1100 nm, respectively. Thus, the thickness of the BOX 3 varies by every 40 nm steps. Here, the laser beam is irradiated with a YAG laser (i.e., yttrium aluminum garnet laser) having a wavelength of 1064 nm. The laser beam is irradiated vertically. Specifically, the laser beam is perpendicular to the SOI substrate 4. Therefore, the laser beam is parallel to a thickness direction of the SOI substrate 4. In this simulation, it is assumed that the thickness of the SOI layer 1 is deviated by a manufacturing error or the likes so that the deviation of the thickness of the SOI layer 1 is in a range between 20000 nm and 20500 nm. The reflection coefficient of the laser beam varies in accordance with the thickness of the BOX 3.

As shown in FIG. 2, the reflection coefficient of the laser beam is changed in accordance with the thickness of the BOX 3 and the thickness of the SOI layer 1. When the thickness of the BOX 3 is about 1100 nm, the reflection coefficient almost keeps constant even when the thickness of the SOI layer 1 is changed, i.e., deviated. This is, the deviation of the reflection coefficient becomes almost null.

The reflection coefficient is determined by the phase of a reflected beam reflected at the interface between the SOI layer 1 and the BOX 3 and by the phase of another reflected beam reflected at another interface between the BOX 3 and the support substrate 2. Here, a refractive index in the air or the vacuum is defined as N1, the refractive index in the SOI layer 1 is defined as N2, and the refractive index in the BOX 3 is defined as N3. The SOI layer 1 is made of silicon, and the BOX 3 is made of silicon oxide. The indexes N1-N3 have the following relationship as N1<N2 and N2>N3. The laser beam is reflected at the interface between the BOX 3 and the SOI layer 1 so that the phase of the reflected beam is transferred forwardly, and the laser beam is also reflected at the interface between the BOX 3 and the support substrate 2 so that the phase of the reflected beam is transferred inversely. Thus, the reflected beam reflected at the interface between the BOX 3 and the SOI layer 1 has the same phase as the incident beam. The reflected beam reflected at the interface between the BOX 3 and the support substrate 2 has an opposite phase opposite to the incident beam. Accordingly, when the phase of the reflected beam reflected at the interface between the BOX 3 and the SOI layer 1 is opposite to the phase of the reflected beam reflected at the interface between the BOX 3 and the support substrate 2, the reflected beams are cancelled and weakened each other. Therefore, the reflective coefficient becomes smaller. To perform such cancellation, the thickness of the BOX 3 is set to be equal to an integral multiple of a wavelength of the laser beam. This is, the thickness of the BOX 3 satisfies following relationship as:

$$D_{BOX}=M\lambda/2N_{BOX}. \tag{F1}$$

Here, $D_{BOX}$ represents the thickness of the BOX 3, $\lambda$ represents the wavelength of the laser beam, $N_{BOX}$ represents a refractive index of the BOX 3, and M represents a natural number.

Thus, when the thickness of the BOX 3 is set to be the integral multiple of the wavelength, for example, 1100 nm, the variation of the reflection coefficient becomes almost zero even when the thickness of the SOI layer 1 is deviated. Thus, even when the thickness of the SOI layer 1 is deviated, the laser beam can reach the predetermined position and the laser beam can be absorbed at the predetermined position. Thus, the semiconductor device 10 can be cut precisely by the laser beam at the cut portion.

In the formula F1, the thickness $D_{BOX}$ of the BOX 3 is set to be $M\lambda/2N_{BOX}$. This condition is optimum case; and therefore, the thickness $D_{BOX}$ can be deviated a little. For example, even when the thickness $D_{BOX}$ of the BOX 3 is in a range between $M\lambda/2N_{BOX}-\lambda/4$ and $M\lambda/2N_{BOX}+\lambda/4$, the variation of the reflection coefficient of the laser beam can be suppressed appropriately when the thickness of the SOI layer 1 is deviated. In this case, the thickness of the insulation film, which is parallel to the laser beam, is in a range between 1000 nm and 1200 nm.

Figure 3:
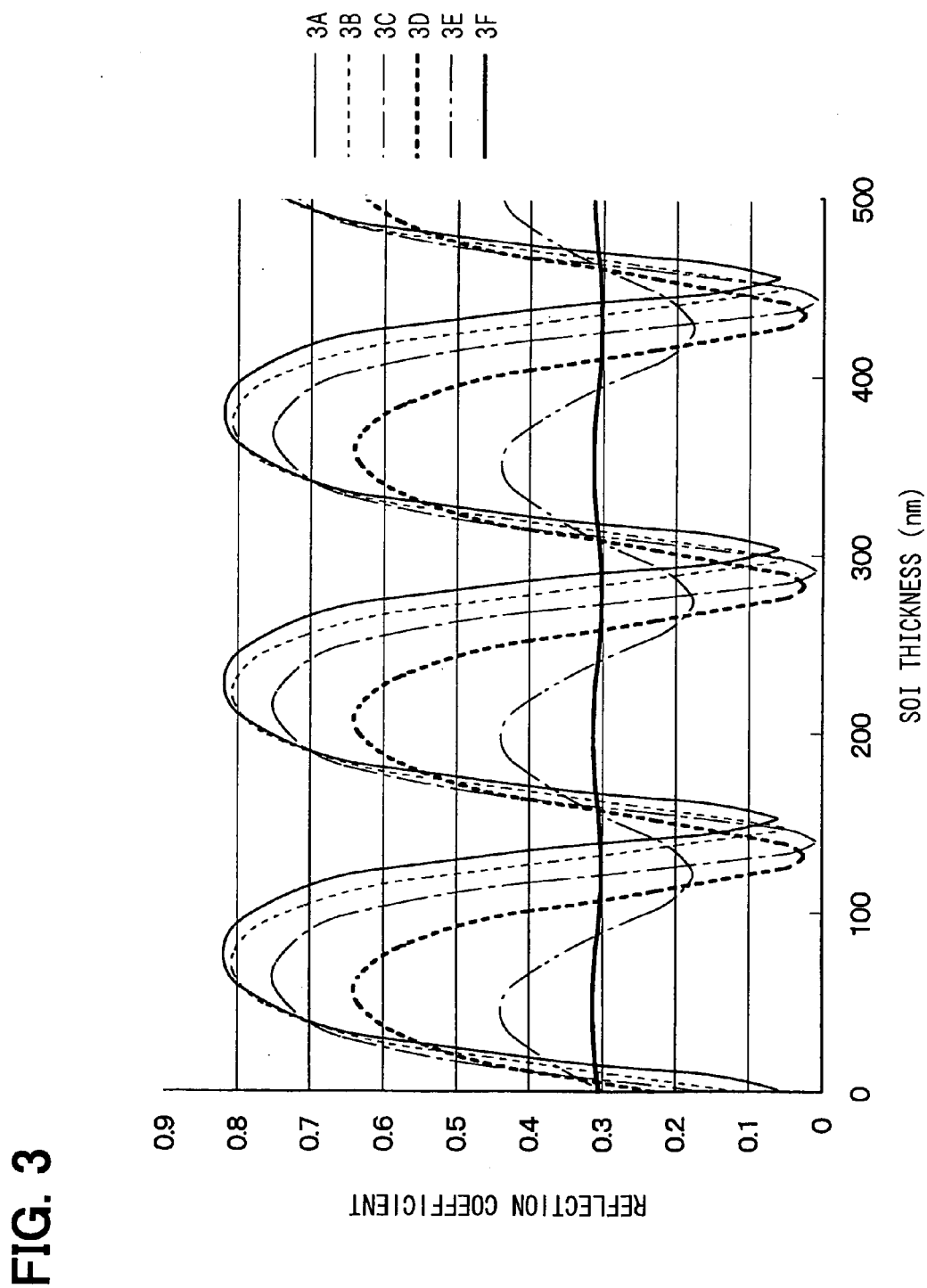
FIG. 3 is a graph showing a relationship between the reflection coefficient of the laser beam and the thickness of the SOI layer in a range between 0 nm and 500 nm in the device having different thickness of the BOX, according to the first embodiment.

In a case where the thickness of the SOI layer 1 is thin, the reflection coefficient of the laser beam is calculated by the simulation. FIG. 3 shows a relationship between the reflection coefficient and the thickness of the SOI layer 1 when the thickness of the BOX 3 is 920 nm, 960 nm, 1000 nm, 1040 nm, 1080 nm or 1100 nm. Here, curves 3A-3F show the devices 10 having the thickness of the BOX 3 of 920 nm, 960 nm, 1000 nm, 1040 nm, 1080 nm and 1100 nm, respectively. The thickness of the SOI layer 1 is in a range between 0 nm and 500 nm. The laser beam irradiation condition is the same as the simulation results shown in FIG. 2.

As shown in FIG. 3, even when the thickness of the SOI layer 1 is thin, the variation of the reflection coefficient of the laser beam becomes almost zero when the thickness of the BOX 3 is equal to 1100 nm.

Thus, the variation of the reflection coefficient of the laser beam becomes zero without depending on the deviation of the thickness of the SOI layer 1 substantially when the thickness of the SOI layer 1 is in a range between 0 nm and 500 nm or in a range between 20000 nm and 20500 nm. Therefore, even if the thickness of the SOI layer 1 is deviated much more, the variation of the reflection coefficient of the laser beam is suppressed. This is, tolerance for the deviation of the thickness of the SOI layer 1 can be secured appropriately.

In this embodiment, the laser beam is irradiated on the SOI layer 1 perpendicularly. This is, the laser beam is parallel to the thickness direction of the SOI layer 1. However, the laser beam is focused at the predetermined position. Therefore, some part of the laser beam is not parallel to the thickness direction of the SOI layer 1. Further, when the laser beam is focused by a lens disposed upside of the device 10, the laser beam is irradiated on the SOI layer 1 with a predetermined slanting angle. In this case, the optimum thickness of the BOX 3 corresponds to a laser path in the BOX 3. Specifically, the optimum thickness of the BOX 3 is determined as a thickness of the BOX 3 in a direction parallel to the laser beam path in the BOX 3.

(Second Embodiment)

Figure 4:
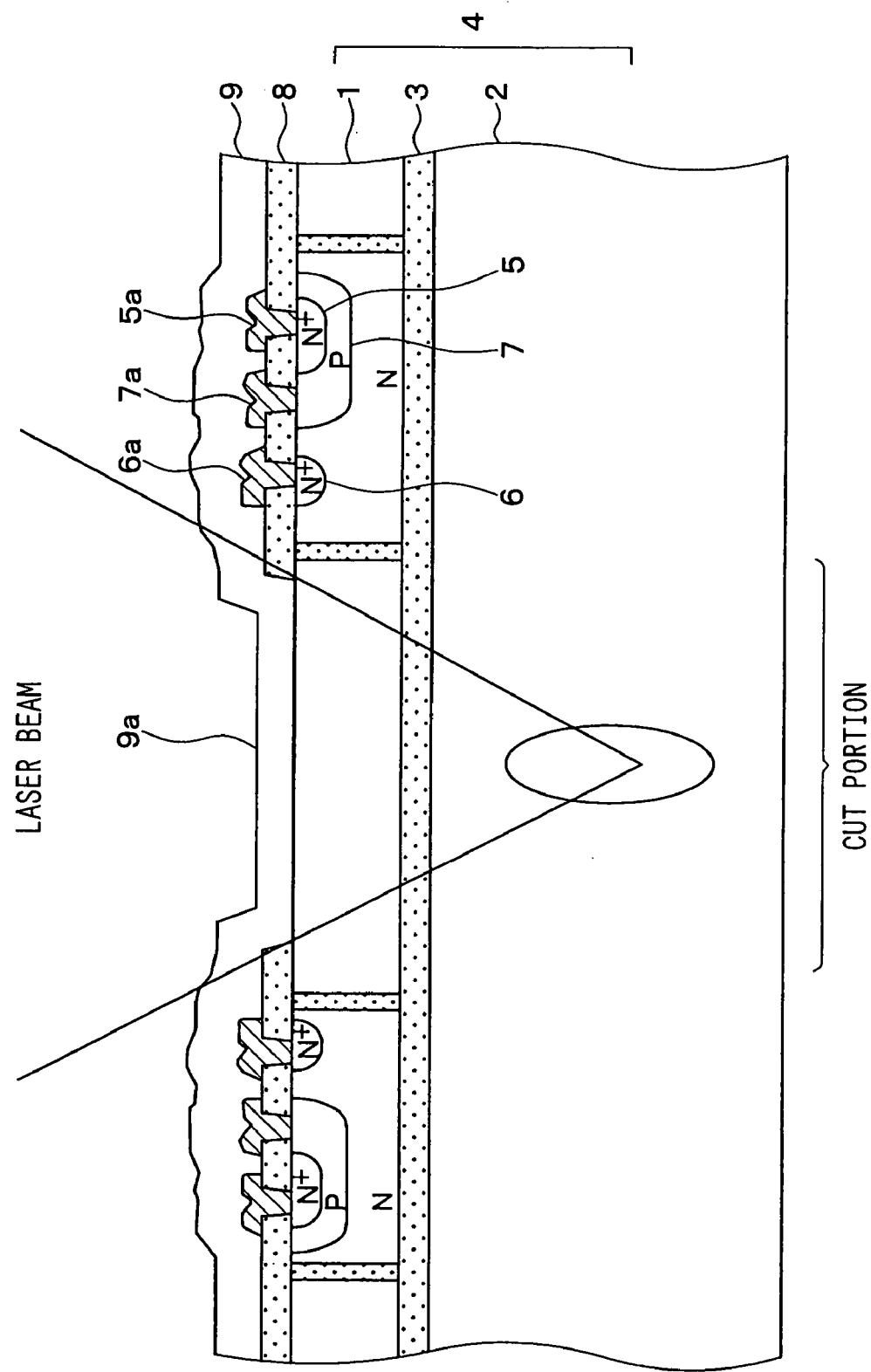
FIG. 4 is a cross-sectional view explaining a laser beam dicing method for dicing a semiconductor device according to a second embodiment of the present invention.

A semiconductor device 10 according to a second embodiment of the present invention is shown in FIG. 4. The protection film 9 is not removed at the cut portion so that the protection film covers the SOI layer 1 at the cut portion. Specifically, the protection film 9 disposed at the cut portion works as an anti-reflection film (i.e., an AR film) 9a. The thickness of the anti-reflection film 9a is determined by simulation results as follows.

Figure 5:
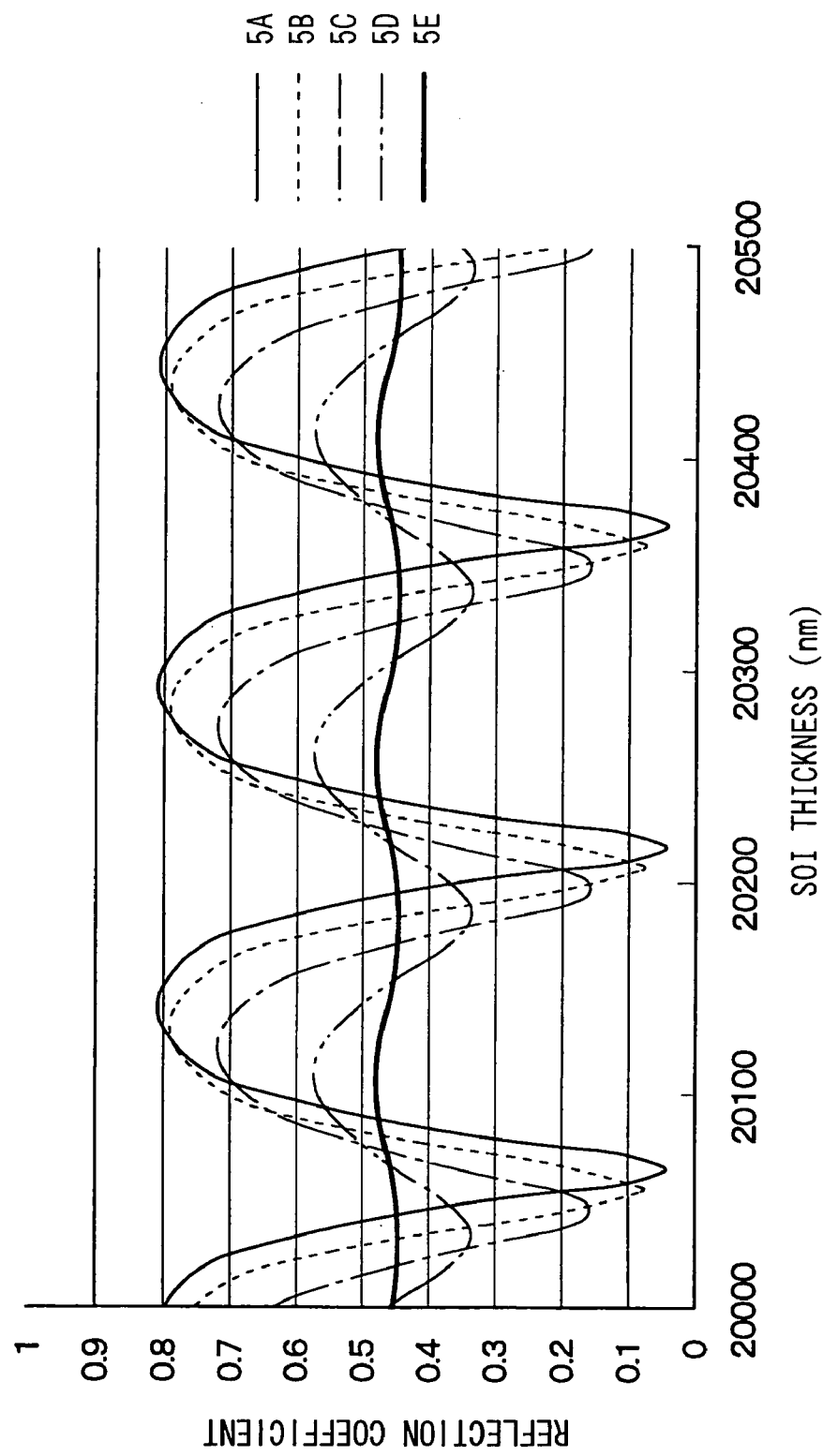
FIG. 5 is a graph showing a relationship between the reflection coefficient of the laser beam and the thickness of the SOI layer in the device having different thickness of an anti-reflection film, according to the second embodiment.

FIG. 5 is simulation results showing a relationship between the reflection coefficient of the laser beam and the thickness of the SOI layer 1 in a case where the device 10 has different thickness of the anti-reflection film 9a. Here, curves 5A–5E show the device 10 having the thickness of the anti-reflection film 9a of 0 nm, 40 nm, 80 nm, 120 nm, and 140 nm, respectively. The thickness of the anti-reflection film 9a of 0 nm in the curve 5A means that the device 10 includes no anti-reflection film 9a. The laser beam irradiation condition is the same as the simulation results shown in FIG. 2. The anti-reflection film 9a is made of SiON (i.e., silicon oxy-nitride) film having a refractive index of 1.87.

As shown in FIG. 5, the device 10 having the anti-reflection film 9a shows a small variation of the reflection coefficient of the laser beam in a case where the thickness of the SOI layer 1 is deviated in a range between 20000 nm and 20500 nm, compared with the device 10 having no anti-reflection film 9a. Specifically, the device 10 with the anti-reflection film 9a having the thickness of 140 nm shows the minimum variation of the reflection coefficient of the laser beam in a case where the thickness of the SOI layer 1 is deviated in a range between 20000 nm and 20500 nm.

Thus, the principle to vary the reflection coefficient of the laser beam is similar to that shown in FIG. 2. Therefore, the variation of the reflection coefficient is determined by the phase of the reflection beam reflected at the interface between the air or the vacuum and the anti-reflection film 9a and by the phase of the other reflection beam reflected at the interface between the anti-reflection film 9a and the SOI layer 1.

In this embodiment, the refractive index in the air or the vacuum is defined as N1, the refractive index in the SOI layer 1 is defined as N2, and the refractive index in the anti-reflection film is defined as N4. The SOI layer 1 is made of silicon, and the anti-reflection film 9 is made of SION. The indexes N1, N2 and N4 have the following relationship as N1<N4, and N4<N2. Contrary, the material of the anti-reflection film 9a is selected to satisfy the above relationships of the refractive indexes N1, N2 and N4. The laser beam is reflected at the interface between the air or the vacuum and the anti-reflection film 9a so that the phase of the reflected beam is transferred inversely, compared with the incident beam. The laser beam is reflected at the interface between the anti-reflection film 9a and the SOI layer 1 so that the phase of the reflected beam is also transferred inversely, compared with the incident beam. Here, the refractive index of the air is 1, and the refractive index of the silicon is 3.5. Therefore, the refractive index of the anti-reflection film 9a is larger than 1 and smaller than 3.5. For example, the anti-reflection film 9a can be formed of a single layer film such as a SiN (i.e., silicon nitride) film, a $SiO_2$ (i.e., silicon dioxide) film, a SiON (i.e., silicon oxy-nitride) film, and an organic film. Further, the anti-reflection film 9a can be formed of a multi-layer film including at least two films of the group including the SiN film, the $SiO_2$ film, the SiON film, and the organic film.

Accordingly, when the phase of the reflected beam reflected at the interface between the air or the vacuum and the anti-reflection film 9a is the same as the phase of the reflected beam reflected at the interface between the anti-reflection film 9a and the SOI layer 1, to cancel and weaken the reflected beams each other so that the reflective coefficient becomes smaller, the thickness of the anti-reflection film 9a is set to be equal to a half of the wavelength of the laser beam. This is because both phase of the reflection beams reflected at the interfaces disposed top and bottom of the anti-reflection film 9a are reversed. Thus, the thickness of the anti-reflection film 9a satisfies following relationship as:

$$D_{AN} = (M-0.5)\lambda/2N_{AN}. \quad (F2)$$

Here, $D_{AN}$ represents the thickness of the anti-reflection film 9a, $\lambda$ represents the wavelength of the laser beam, $N_{AN}$ represents a refractive index of the anti-reflection film 9a, and M represents a natural number.

Thus, the thickness of the anti-reflection film 9a is set to be equal to a half of the wavelength of the laser beam. For example, the thickness of the anti-reflection film 9a is set to about 140 nm. Precisely, the thickness of the anti-reflection film 9a is set to 142 nm. In this case, the variation of the reflection coefficient of the laser beam becomes zero substantially even when the thickness of the SOI film 1 is deviated. Thus, even if the thickness of the SOI layer 1 is deviated much more, the variation of the reflection coefficient of the laser beam is suppressed. Therefore, the laser beam reaches the predetermined position and the laser beam can be absorbed at the predetermined position. Thus, the semiconductor device 10 can be cut precisely by the laser beam at the cut portion.

In the formula F2, the thickness $D_{AN}$ of the anit-reflection film 9a is set to be $(M-0.5)\lambda/2N_{AN}$. This condition is optimum case; and therefore, the thickness $D_{AN}$ can be deviated a little. For example, even when the thickness $D_{AN}$ of the anti-reflection film 9a is in a range between $(M-0.5)$ $\lambda/2N_{BOX}-\lambda/4$ and $(M-0.5)\lambda/2N_{BOX}+\lambda/4$, the variation of the reflection coefficient of the laser beam can be suppressed appropriately when the thickness of the SOI layer 1 is deviated.

Figure 6:
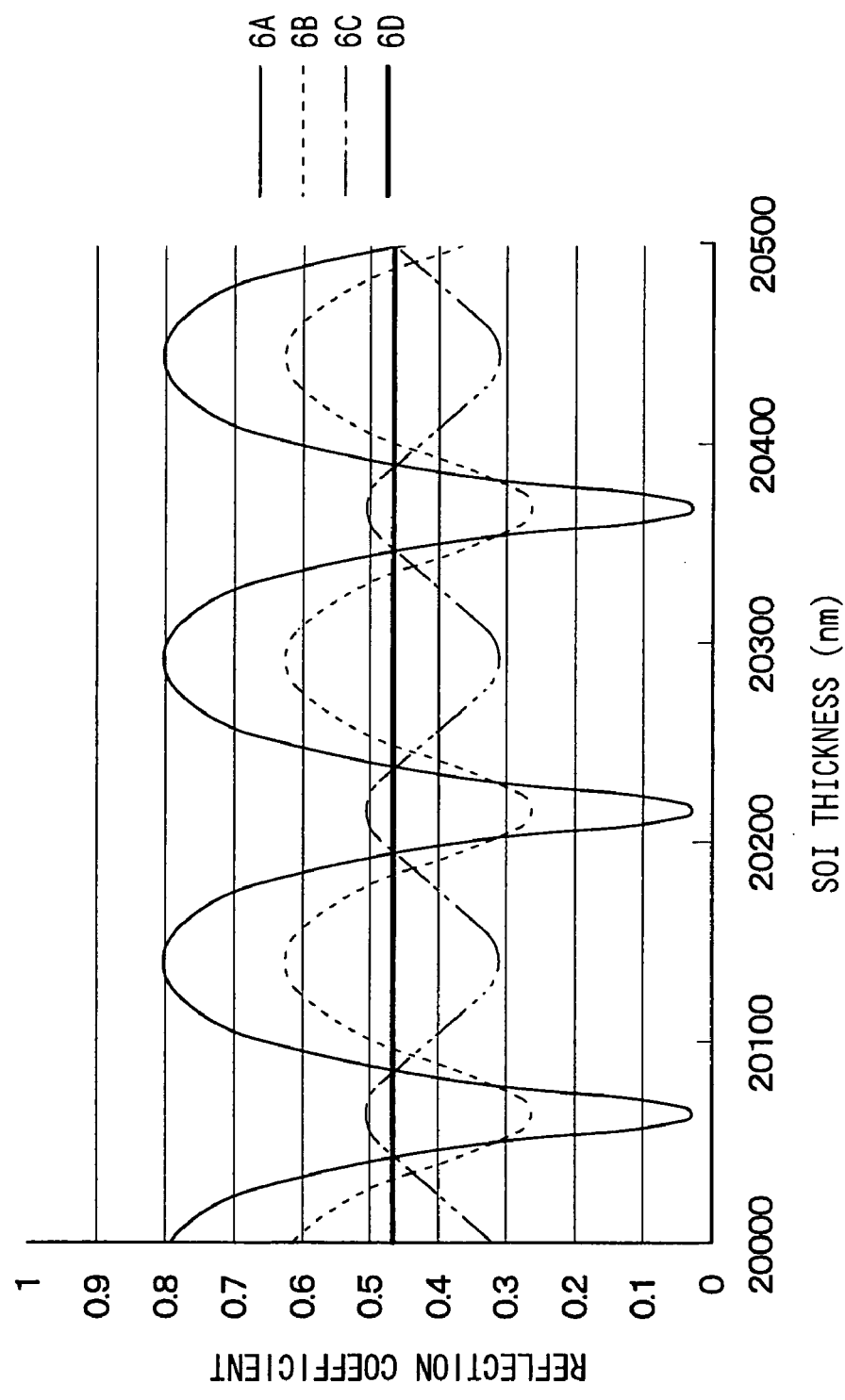
FIG. 6 is a graph showing a relationship between the reflection coefficient of the laser beam and the thickness of the SOI layer in the device having different anti-reflection film, according to the second embodiment.

To obtain the optimum material composing the anti-reflection film 9a, another simulation is performed. FIG. 6 explains simulation results showing the device 10 having different anti-reflection film 9a. In FIG. 6, a curve 6A shows the device 10 having no anti-reflection film 9a. A curve 6B shows the device 10 having the anti-reflection film 9a formed of $SiO_2$ film with the thickness of 183 nm. The $SiO_2$ film has the refractive index of 1.45. A curve 6C shows the device 10 having the anti-reflection film 9a formed of SiN film with the thickness of 133 nm. The SiN film has the refractive index of 2.0. A curve 6D shows the device 10 having the anti-reflection film 9a formed of SiON film with the thickness of 142 nm. The SiON film has the refractive index of 1.87. The laser beam irradiation condition is the same as the simulation results shown in FIG. 2. Here, each device 10 has the thickness of the anti-reflection film 9a almost equal to the half of the wavelength of the laser beam.

As shown in FIG. 6, the variation of the reflection coefficient of the laser beam in each device 10 having the anti-reflection film 9a is smaller than that in the device 10 having no anti-reflection film 9a. Specifically, in the devices 10 having anti-reflection film 9a formed of the $SiO_2$ film, the SiN film, and the SiN film, the variation of the reflection coefficient of the laser beam in each device 10 becomes smaller in the order of the $SiO_2$ film, the SiN film, and the SiN film when the thickness of the SOI film 1 is deviated.

Thus, when the anti-reflection film 9a is made of the material having the refractive index in a range between 1 and 3.5, the laser beam can be absorbed at the predetermined position even when the thickness of the SOI substrate is changed. Specifically, when the anti-reflection film 9a is formed of the SiOn film, the variation of the reflection coefficient of the laser beam becomes zero substantially so that the laser beam can be absorbed much precisely at the predetermined position. Thus, the semiconductor device 10 can be cut precisely by the laser beam at the cut portion.

In this embodiment, the laser beam is irradiated on the surface of the first semiconductor layer in air or vacuum. When the anti-reflection film is made of a material having a refractive index substantially equal to a square root of a refractive index of silicon, the laser beam can be absorbed much precisely at the predetermined position.

In this embodiment, the laser beam is irradiated on the SOI layer 1 perpendicularly. This is, the laser beam is parallel to the thickness direction of the SOI layer 1. However, the laser beam is focused at the predetermined position. Therefore, some part of the laser beam is not parallel to the thickness direction of the SOI layer 1. Further, when the laser beam is focused by a lens disposed upside of the device 10, the laser beam is irradiated on the SOI layer 1 with a predetermined slanting angle. In this case, the optimum thickness of the anti-reflection film 9a corresponds to a laser path in the anti-reflection film 9a. Specifically, the optimum thickness of the anti-reflection film 9a is determined as a thickness of the anti-reflection film 9a in a direction parallel to the laser beam path.

Further, in the second embodiment, the anti-reflection film 9a is a single layer film. However, a multi-layer film can be used for the anti-reflection film 9a. In this case, the total reflection coefficient of the laser beam is taken into consideration.

(Third Embodiment)

A semiconductor device 10 according to a third embodiment of the present invention is such that the thickness of the BOX 3 satisfies with the formula F1, and the device 10 includes the anti-reflection film 9a on the SOI layer 1 at the cut portion.

Figure 7:
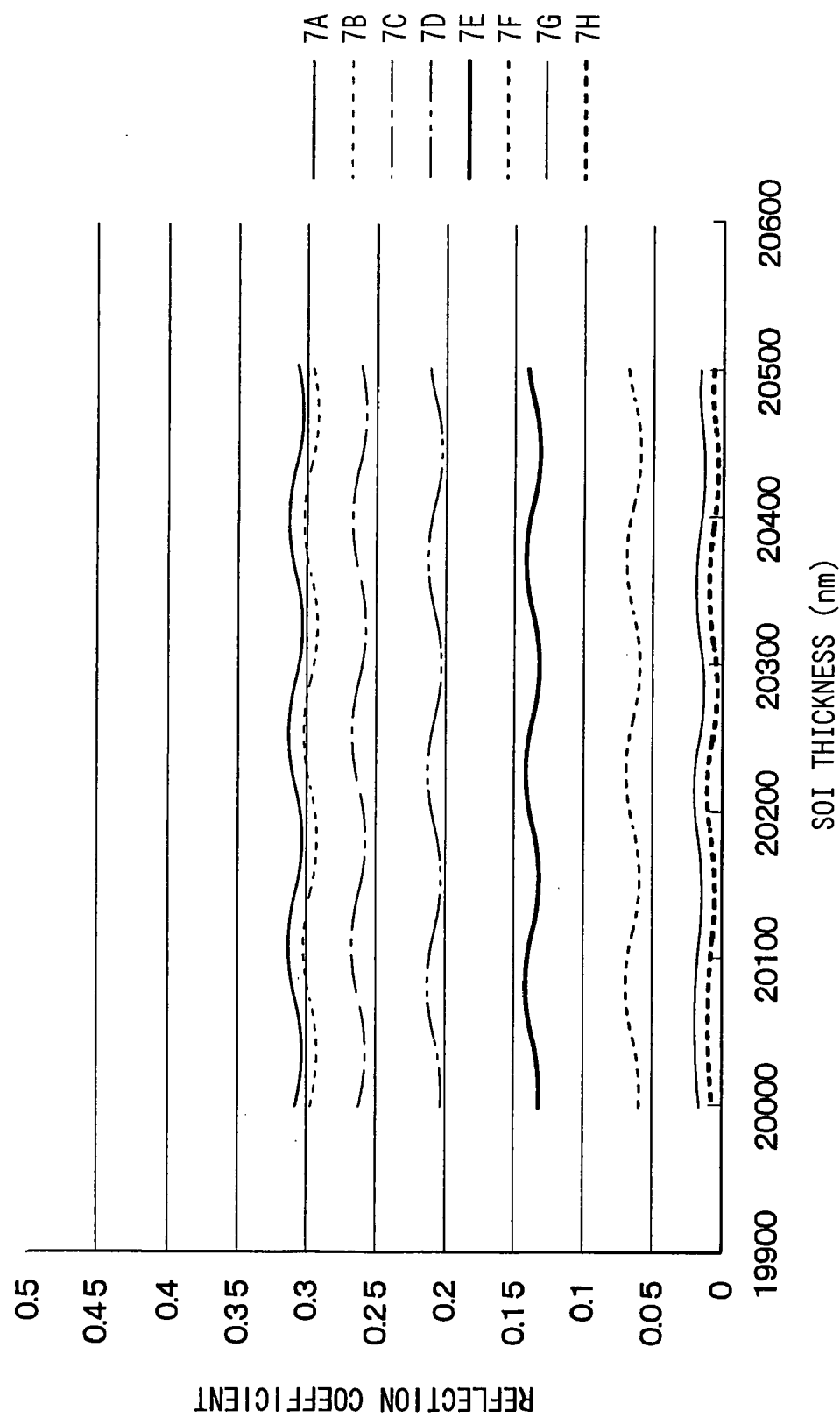
FIG. 7 is a graph showing a relationship between the reflection coefficient of the laser beam and the thickness of the SOI layer in the device with the optimum thickness of the BOX and having different thickness of the anti-reflection film, according to a third embodiment of the present invention.

Simulation results of different devices 10 having different thickness of the anti-reflection film 9a are shown in FIG. 7. Here, curves 7A–7H show the devices 10 having the thickness of the anti-reflection film 9a of 0 nm, 20 nm, 40 nm, 60 nm, 80 nm, 100 nm, 120 nm, and 133 nm, respectively. Here, the thickness of the BOX 3 is set to be the optimum thickness, for example, 1100 nm. The anti-reflection film 9a is formed of a poly SiN film having the refractive index of 2.0.

Figure 8:
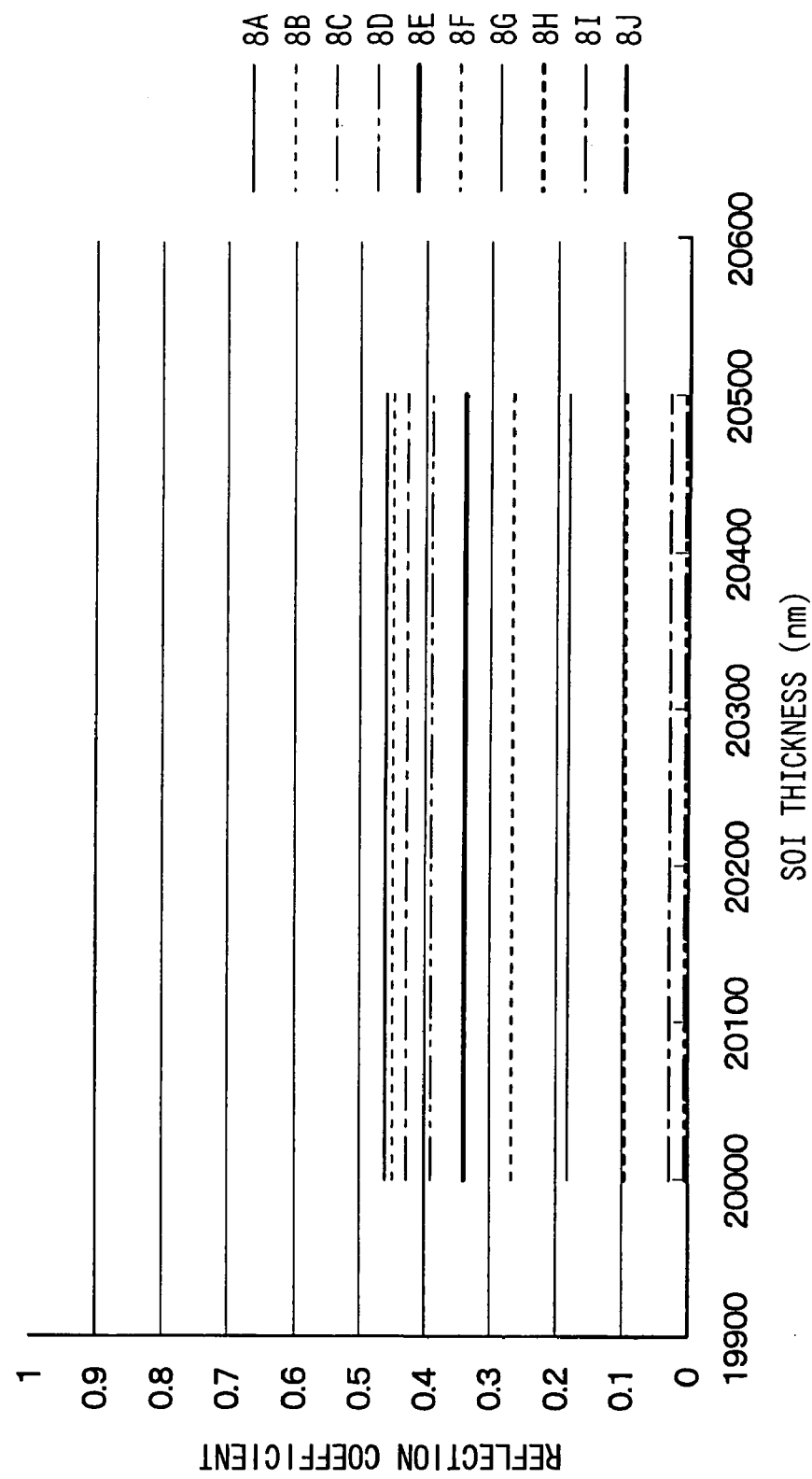
FIG. 8 is a graph showing a relationship between the reflection coefficient of the laser beam and the thickness of the SOI layer in the device with the optimum thickness of the anti-reflection film and having different thickness of the BOX, according to the third embodiment.

Further, simulation results of different devices 10 having different thickness of the BOX 3 are shown in FIG. 8. In FIG. 8, curves 8A–8J show the devices 10 having the thickness of the BOX 3 of 920 nm, 940 nm, 960 nm, 980 nm, 1000 nm, 1020 nm, 1040 nm, 1060 nm, 1080 nm, and 1100 nm, respectively. The anti-reflection film 9a is formed of a poly SiN film having the thickness of 142 nm and having the refractive index of 2.0.

As shown in FIG. 7, the variation of the reflection coefficient of the laser beam is small when the thickness of the SOI layer 1 is deviated in a case where the thickness of the anti-reflection film 9a is in a range between 0 nm and 133 nm. This is because the thickness of the BOX 3 satisfies with the formula F1. As the thickness of the anti-reflection film 9a approaches to the optimum thickness, the reflection coefficient of the laser beam becomes smaller.

Thus, the variation of the reflection coefficient of the laser beam becomes zero substantially without depending on the deviation of the thickness of the SOI layer 1 even when the thickness of the anti-reflection film 9a is deviated by the manufacturing error. Thus, the tolerance for the deviation of the thickness of the anti-reflection film 9a can be secured appropriately. Further, when the thickness of the BOX 3 is set to be optimum, and the thickness of the anti-reflection film 9a is set to be optimum, the reflection coefficient of the laser beam becomes zero substantially. Therefore, the laser beam can be absorbed at the predetermined position effectively. Thus, the efficiency of the laser beam is improved.

Furthermore, as shown in FIG. 8, the variation of the reflection coefficient of the laser beam becomes zero substantially without depending on the deviation of the thickness of the SOI layer 1 even when the thickness of the BOX 3 is deviated by the manufacturing error. This is because the device 10 includes the anti-reflection film 9a. Thus, the tolerance for the deviation of the thickness of the BOX 3 can be secured appropriately. Further, when the thickness of the BOX 3 is set to be optimum, and the thickness of the anti-reflection film 9a is set to be optimum, the reflection coefficient of the laser beam becomes zero substantially. Therefore, the laser beam can be absorbed at the predetermined position effectively.

(Fourth Embodiment)

Figure 9:
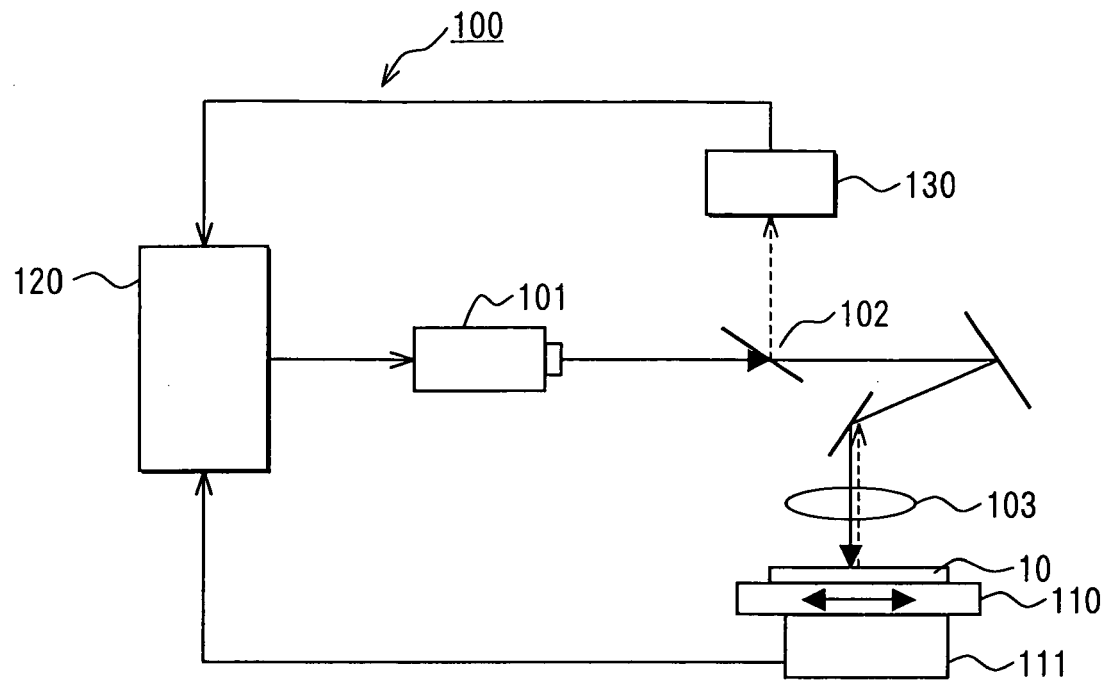
FIG. 9 is a block diagram showing cutting equipment according to a fourth embodiment of the present invention.

Cutting equipment 100 for dicing the semiconductor device 10 according to a fourth embodiment of the present invention is shown in FIG. 9. The semiconductor device 10 is a semiconductor wafer. The equipment 100 includes a laser 101, a half mirror 102, a lens 103, a stage 110, a stage driving system 111, a controller 120, and a laser beam detecting device 130. The laser 101 irradiates the laser beam. The half mirror 102 reflects the reflected laser beam reflected at the interface between the SOI layer 1 and the BOX 3 or the interface between the BOX 3 and the support substrate 2. The lens 103 focuses the laser beam at the predetermined position in the semiconductor device 10. The semiconductor device 10 is mounted on the stage 110. The stage is driven by the stage driving system 111. The stage driving system 111 outputs information for a positioning of the stage 110 to the controller 120. The reflected laser beam returns from the semiconductor device 10 through the lens 103, a mirror and the half mirror 102. Then, the reflected laser beam is detected by the laser beam detecting device 130. The laser beam detecting device 130 outputs a data of the reflected laser beam to the controller 120. The controller 120 controls the laser 101.

The cutting equipment 100 cuts the semiconductor device 10 as follows.

Figure 10:
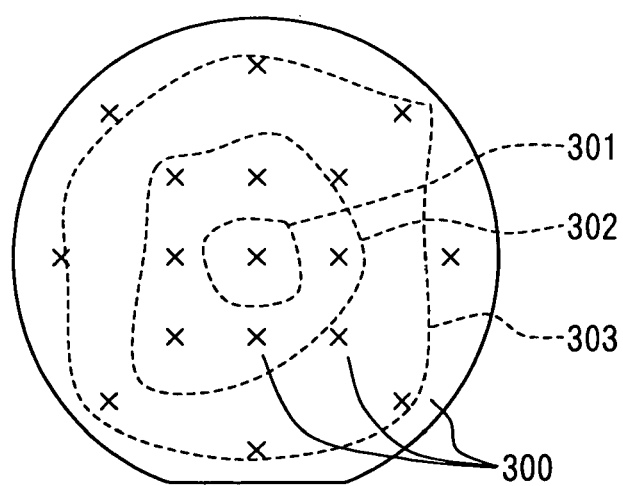
FIG. 10 is a plan view showing a laser power mapping of the semiconductor device as a wafer, according to the fourth embodiment.

Firstly, the laser 101 irradiates the laser beam, which has weak beam power, so that the laser beam is used for measurement of the reflection coefficient of the laser beam. Therefore, the laser beam having weak laser power does not damage the semiconductor device 10. During the laser 101 irradiates the laser beam, the stage 110 is displaced in accordance with a predetermined movement. Thus, the reflection coefficient of the whole semiconductor device 10 as the wafer is determined so that a reflection coefficient mapping of the semiconductor device 10 is obtained. Specifically, as shown in FIG. 10, the reflection coefficient at a predetermined position 300 as a measurement point on the SOI substrate 4 is detected and measured. By using the information for the positioning of the stage 110 and the data of the reflected laser beam, the controller 120 calculates the reflection coefficient mapping. Thus, on the basis of the reflection coefficient mapping, the controller 120 calculates an optimum laser power mapping. Specifically, the controller 120 calculates a power contour. In FIG. 10, three power contours 301–303 are calculated. The laser power on the surface of the SOI substrate 4 disposed on the same contour 301–303 is constant. In view of the optimum laser power mapping, the controller 120 controls the laser power of the laser 101 to be an optimum laser power, which is obtained by the optimum laser power mapping, so that the laser beam cuts the semiconductor device 10 appropriately.

(Fifth Embodiment)

Figure 11:
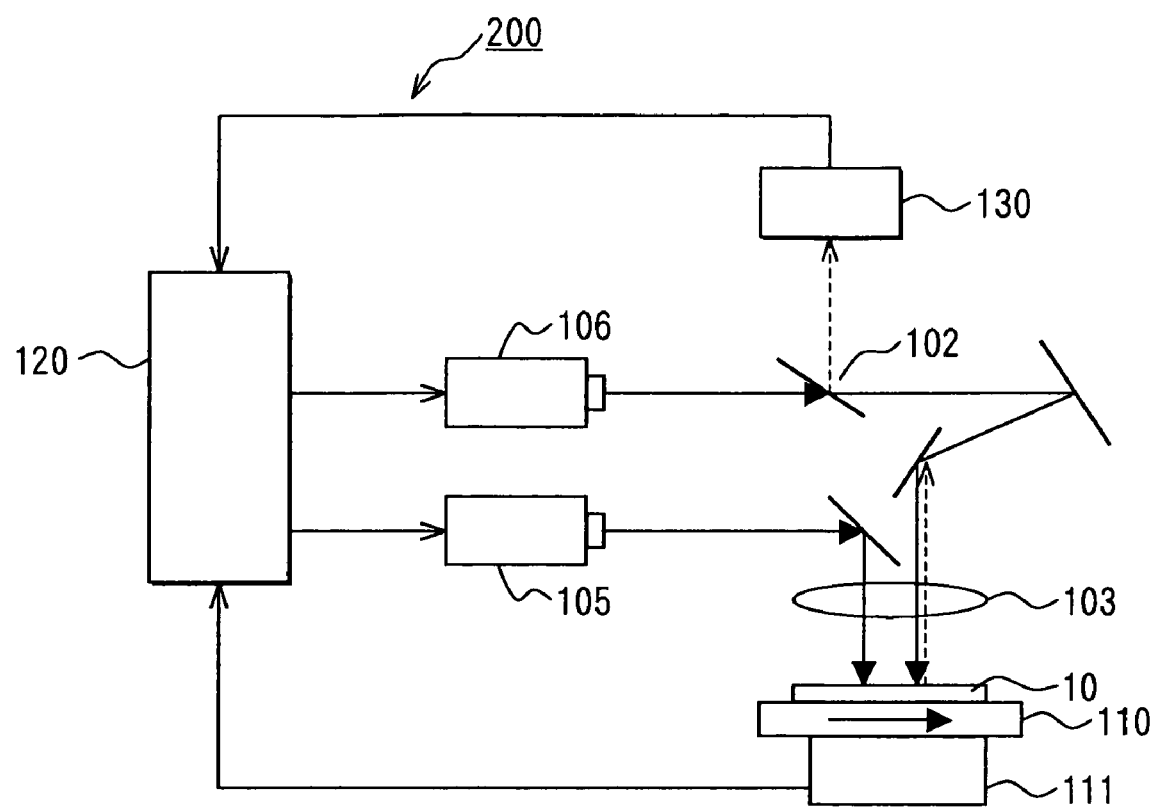
FIG. 11 is a block diagram showing cutting equipment according to a fifth embodiment of the present invention.

Cutting equipment 200 for dicing the semiconductor device 10 according to a fifth embodiment of the present invention is shown in FIG. 11. The equipment 200 includes the first laser 105 and the second laser 106. The first laser 105 irradiates the laser beam having sufficient laser power, and the second laser 106 irradiates the laser beam having weak laser power. The laser beam of the first laser 105 cuts the semiconductor device 10. The laser beam of the second laser 106 is used for detecting the reflection coefficient of the reflected laser beam.

The cutting equipment 200 cuts the semiconductor device 10 as follows.

The laser beams outputted from the first and second lasers 105, 106 are irradiated on the SOI substrate 4 at the same time. In this case, the laser beam having weak laser power for detecting the reflection coefficient irradiates at a certain position on the SOI substrate 4. The laser beam having sufficient laser power for cutting the semiconductor device 10 irradiates at another position on the SOI substrate 4, which is backward of the certain position of the laser beam outputted from the second laser 106.

The controller 120 calculates the optimum laser power at the certain position on the basis of the reflection coefficient of the laser beam obtained from the reflected laser beam outputted from the second laser 106 by the detecting device 130. When the laser beam outputted from the first laser 105 irradiates at the certain position, the controller 120 controls the laser power of the first laser 105 to be the optimum laser power.

Thus, the laser power of the laser beam outputted from the first laser 105 is controlled appropriately so that the semiconductor device is cut and diced by the laser beam of the first laser.

Such changes and modifications are to be understood as being within the scope of the present invention as defined by the appended claims.

What is claimed is:

1. A method for cutting a semiconductor device comprising a first semiconductor layer, an insulation layer, and a second semiconductor layer, which are laminated in this order, the method comprising the steps of:
    forming a semiconductor part in the first semiconductor layer;
    irradiating a laser beam on a surface of the first semiconductor layer; and
    cutting the device into a semiconductor chip by using the laser beam,
    wherein the laser beam is reflected at an interface between the first semiconductor layer and the insulation layer so that a first reflected beam is generated, and the laser beam is reflected at an interface between the insulation layer and the second semiconductor layer so that a second reflected beam is generated, and
    wherein the insulation film has a thickness, which is determined to weaken the first and second reflected beams each other.

2. The method according to claim 1,
    wherein the thickness of the insulation film is equal to an integral multiple of a wavelength of the laser beam so that a phase of the first reflected beam is opposite to a phase of the second reflected beam.

3. The method according to claim 1,
    wherein the thickness of the insulation film, which is parallel to the laser beam, is defined as $D_{BOX}$,
    wherein the laser beam has a wavelength defined as $\lambda$,
    wherein the insulation film has a refractive index defined as $N_{BOX}$,
    wherein the thickness of the insulation film is in a range between $M\lambda/2N_{BOX}-\lambda/4$ and $M\lambda/2N_{BOX}+\lambda/4$, and
    wherein M represents a natural number.

4. The method according to claim 1,
    wherein the thickness of the insulation film, which is parallel to the laser beam, is in a range between 1000 nm and 1200 nm.

5. The method according to claim 1, further comprising the step of:
    forming an anti-reflection film on the surface of the first semiconductor layer before the step of irradiating the laser beam on the surface of the first semiconductor layer so that the laser beam is irradiated on the first semiconductor layer through the anti-reflection film,
    wherein the laser beam is reflected at an interface between the anti-reflection film and the first semiconductor layer so that a third reflected beam is generated, and the laser beam is reflected on the anti-reflection film so that a fourth reflected beam is generated, and
    wherein the anti-reflection film has a thickness, which is determined to weaken the third and fourth reflected beams each other.

6. The method according to claim 1, further comprising the steps of:
 measuring a reflection coefficient of the laser beam; and
 controlling a laser power of the laser beam on the basis of the reflection coefficient.

7. The method according to claim 6,
 wherein the reflection coefficient is measured so that a reflection coefficient mapping of a whole surface of the semiconductor device is obtained.

8. The method according to claim 7,
 wherein the laser power of the laser beam is controlled on the basis of the reflection coefficient mapping so that the laser power is adjusted to be an optimum laser power corresponding to the reflection coefficient mapping.

9. The method according to claim 6,
 wherein the step of measuring the reflection coefficient is performed together with the step of controlling the laser power of the laser beam on the basis of the reflection coefficient so that the semiconductor device is cut into the semiconductor chip.

10. The method according to claim 1,
 wherein the first semiconductor layer is a SOI layer, and the second semiconductor layer is a support substrate made of silicon,
 wherein the insulation film is made of silicon oxide, and
 wherein the device is formed from a SOI substrate.

11. A method for cutting a semiconductor device comprising a first semiconductor layer, an insulation layer, and a second semiconductor layer, which are laminated in this order, the method comprising the steps of:
 forming a semiconductor part in the first semiconductor layer;
 irradiating a laser beam on a surface of the first semiconductor layer;
 forming an anti-reflection film on the surface of the first semiconductor layer before the step of irradiating the laser beam on the surface of the first semiconductor layer so that the laser beam is irradiated on the first semiconductor layer through the anti-reflection film; and
 cutting the device into a semiconductor chip by using the laser beam,
 wherein the laser beam is reflected at an interface between the anti-reflection film and the first semiconductor layer so that a third reflected beam is generated, and the laser beam is reflected on the anti-reflection film so that a fourth reflected beam is generated, and
 wherein the anti-reflection film has a thickness, which is determined to weaken the third and fourth reflected beams each other.

12. The method according to claim 11,
 wherein the thickness of the anti-reflection film is equal to a half of a wavelength of the laser beam so that the phase of the third reflected beam is opposite to the phase of the fourth reflected beam.

13. The method according to claim 11,
 wherein the thickness of the anti-reflection film, which is parallel to the laser beam, is defined as $D_{AN}$,
 wherein the laser beam has a wavelength defined as $\lambda$,
 wherein the anti-reflection film has a refractive index defined as $N_{AN}$,
 wherein the thickness of the anti-reflection film is in a range between $(M-0.5)\lambda/2N_{AN}-\lambda/4$ and $(M-0.5)\lambda/2N_{AN}+\lambda/4$, and
 wherein M represents a natural number.

14. The method according to claim 13,
 wherein the refractive index of the anti-reflection film is in a range between 1 and 3.5.

15. The method according to claim 11,
 wherein the step of irradiating the laser beam on the surface of the first semiconductor layer is performed in air or vacuum, and
 wherein the anti-reflection film is made of a material having a refractive index substantially equal to a square root of a refractive index of silicon.

16. The method according to claim 11,
 wherein the anti-reflection film is formed of a single layer film of a SiN film, a $SiO_2$ film, or a SiON film.

17. The method according to claim 11,
 wherein the anti-reflection film is formed of a multi-layer film including at least two types of films selected in a group including a SiN film, a $SiO_2$ film, and a SiON film.

18. The method according to claim 11, further comprising the steps of:
 measuring a reflection coefficient of the laser beam; and
 controlling a laser power of the laser beam on the basis of the reflection coefficient.

19. The method according to claim 18,
 wherein the reflection coefficient is measured so that a reflection coefficient mapping of a whole surface of the semiconductor device is obtained.

20. The method according to claim 19,
 wherein the laser power of the laser beam is controlled on the basis of the reflection coefficient mapping so that the laser power is adjusted to be an optimum laser power corresponding to the reflection coefficient.

21. The method according to claim 18,
 wherein the step of measuring the reflection coefficient is performed together with the step of controlling the laser power of the laser beam on the basis of the reflection coefficient so that the semiconductor device is cut into the semiconductor chip.

22. The method according to claim 11,
 wherein the first semiconductor layer is a SOI layer, and the second semiconductor layer is a support substrate made of silicon,
 wherein the insulation film is made of silicon oxide, and
 wherein the device is formed from a SOI substrate.

* * * * *